United States Patent
Kurashina et al.

(10) Patent No.: US 9,326,372 B2
(45) Date of Patent: Apr. 26, 2016

(54) SEMICONDUCTOR DEVICE MANUFACTURING METHOD AND SEMICONDUCTOR MOUNTING SUBSTRATE

(71) Applicant: FUJITSU LIMITED, Kawasaki-shi, Kanagawa (JP)

(72) Inventors: Mamoru Kurashina, Atsugi (JP); Daisuke Mizutani, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/682,024

(22) Filed: Apr. 8, 2015

(65) Prior Publication Data

US 2015/0216040 A1  Jul. 30, 2015

Related U.S. Application Data

(62) Division of application No. 14/134,289, filed on Dec. 19, 2013, now Pat. No. 9,048,332.

(30) Foreign Application Priority Data

Mar. 18, 2013 (JP) .................................. 2013-054525

(51) Int. Cl.
*H01L 23/485* (2006.01)
*H05K 1/02* (2006.01)
(Continued)

(52) U.S. Cl.
CPC .......... *H05K 1/0271* (2013.01); *H01L 21/4853* (2013.01); *H01L 21/76877* (2013.01);
(Continued)

(58) Field of Classification Search
CPC .............. H01L 23/14; H01L 23/76877; H01L 23/49816; H01L 23/49827; H01L 23/49833; H01L 23/481; H01L 23/49822; H01L 2224/08235; H01L 2224/16235; H01L 2924/00; H01L 2224/81191
USPC .................. 257/621, 774, E21.797, 737, 738, 257/E23.021, E23.069, 772, 778, 779, 697, 257/698, 700, 773, E23.003, E23.006, 257/E23.007, E23.008, E23.009, E23.063, 257/E23.067
See application file for complete search history.

(56) References Cited

U.S. PATENT DOCUMENTS 6,080,936 A  6/2000  Yamasaki et al.
6,900,393 B1  5/2005  Cachina et al.
(Continued)

FOREIGN PATENT DOCUMENTS

JP  H10-12990  1/1998

*Primary Examiner* — Jasmine Clark
(74) *Attorney, Agent, or Firm* — Kratz, Quintos & Hanson, LLP (57) ABSTRACT

A semiconductor device manufacturing method includes: a first-process for placing, on a first-substrate on which traces and first-electrodes are formed, each of the first-electrodes being connected to one of traces, a second-substrate in which through-holes corresponding to the first-electrodes and relay-members are disposed, each of the relay-members being formed of solder, penetrating through one of the through-holes, and projecting from both ends of the one of the through-holes, so that the first-electrodes are aligned with the through-holes in a plan view; a second-process for melting the relay-members so that the relay-members are connected to the first-electrodes, after the first-process; and a third-process for placing a semiconductor substrate on which a second-electrodes corresponding to the first-electrodes are formed on a side opposite to the first-substrate across the second-substrate, after the second-process, to connect the first-electrodes and the second-electrodes to each other via the relay-members.

4 Claims, 11 Drawing Sheets

(51) Int. Cl.
*H01L 23/00* (2006.01)
*H01L 21/768* (2006.01)
*H01L 23/498* (2006.01)
*H01L 21/48* (2006.01)
*H05K 1/03* (2006.01)
*H05K 1/11* (2006.01)

(52) U.S. Cl.
CPC .... *H01L23/49816* (2013.01); *H01L 23/49822* (2013.01); *H01L 23/49827* (2013.01); *H01L 23/49833* (2013.01); *H01L 23/49894* (2013.01); *H01L 24/81* (2013.01); *H05K 1/0298* (2013.01); *H05K 1/0326* (2013.01); *H05K 1/0346* (2013.01); *H05K 1/115* (2013.01); *H01L 2224/0401* (2013.01); *H01L 2224/08235* (2013.01); *H01L 2224/131* (2013.01); *H01L 2224/16235* (2013.01); *H01L 2224/8121* (2013.01); *H01L 2224/81191* (2013.01); *H01L 2224/81815* (2013.01); *H01L 2924/1306* (2013.01); *H01L 2924/351* (2013.01); *H05K 2201/0154* (2013.01); *H05K 2201/09136* (2013.01); *H05K 2201/10734* (2013.01)

(56) References Cited

U.S. PATENT DOCUMENTS

| 8,062,968 | B1* | 11/2011 | Conn | H01L 23/055 257/779 |
| 2003/0160325 | A1* | 8/2003 | Yoneda et al. | 257/758 |
| 2004/0080040 | A1* | 4/2004 | Dotta et al. | 257/698 |

* cited by examiner

SEMICONDUCTOR DEVICE MANUFACTURING METHOD AND SEMICONDUCTOR MOUNTING SUBSTRATE

CROSS-REFERENCE TO RELATED APPLICATION

This application is a Divisional Application of prior application Ser. No. 14/134,289 filed on Dec. 19, 2013, now U.S. Pat. No. 9,048,332, which is based upon and claims the benefit of priority of the prior Japanese Patent Application No. 2013-054525, filed on Mar. 18, 2013, the entire contents of which are incorporated herein by reference.

FIELD

The embodiment discussed herein is related to a semiconductor device manufacturing method and a semiconductor mounting substrate.

BACKGROUND

The number of terminals of an integrated circuit (IC) chip has been increasing. Therefore, recent IC chips are mounted on land grid array (LGA) substrates or ball grid array (BGA) substrates. In a LGA substrate, pads in a reticular pattern are arranged on its back. In a BGA substrate, pads in a reticular pattern are arranged on its back and spherical solder (referred to below as solder balls) is jointed to the pads.

Japanese Laid-open Patent Publication No. 10-12990 is an example of related art.

An IC chip having solder-ball-jointed pads (referred to below as chip pads) arranged in a reticular pattern is mounted on a LGA substrate or BGA substrate (referred to below as a BGA substrate or the like).

The pads (referred to below as substrate pads) corresponding to chip pads are arranged in a reticular pattern on a BGA substrate or the like. The IC chip is placed on the BGA substrate or the like so that the chip pads are aligned with the substrate pads, and then it is connected to the BGA substrate or the like through the reflow process.

The BGA substrate or the like includes a planar insulating substrate, substrate pads formed on its surface, external pads formed on its back, and traces that penetrate through the insulating substrate and connect the substrate pads and the external pads to each other.

The thermal expansion coefficient of the material (for example, epoxy resin) of the insulating substrate greatly differs from that of the material (for example, copper) of traces. The difference in the thermal expansion coefficient bends the BGA substrate or the like and its surface becomes uneven.

Accordingly, if the IC chip is placed on the BGA substrate or the like, only some solid balls make contact with the substrate pads and gaps are generated between the other solder balls and the substrate pads.

The larger the BGA substrate or the like, the larger the bend and unevenness of the substrate. As a result, the gaps between solder balls and substrate pads are widened. The gaps between solder balls and substrate pads remain after the reflow process, thereby causing failed connection between some chip pads and substrate pads.

SUMMARY

According to an aspect of the invention, a semiconductor device manufacturing method includes: a first-process for placing, on a first-substrate on which traces and first-electrodes are formed, each of the first-electrodes being connected to one of traces, a second-substrate in which through-holes corresponding to the first-electrodes and relay-members are disposed, each of the relay-members being formed of solder, penetrating through one of the through-holes, and projecting from both ends of the one of the through-holes, so that the first-electrodes are aligned with the through-holes in a plan view; a second-process for melting the relay-members so that the relay-members are connected to the first-electrodes, after the first-process; and a third-process for placing a semiconductor substrate on which a second-electrodes corresponding to the first-electrodes are formed on a side opposite to the first-substrate across the second-substrate, after the second-process, to connect the first-electrodes and the second-electrodes to each other via the relay-members.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

Each of FIG. 2A

Each of FIG. 3A

Each of FIG. 4A

Each of FIG. 7A, FIG. 7B, FIG. 7C

Each of FIG. 11A

Each of FIG. 12A, FIG. 12B

DESCRIPTION OF EMBODIMENT

Hereinafter, an embodiment of the present disclosure will be described with respect to the drawings. However, the technical scope of the present disclosure is not limited to the embodiment and is defined by the matters described in claims and their equivalents. Throughout the drawings, the same reference numerals are used for the corresponding components to omit their descriptions.

(1) Manufacturing Method

Figure 1:
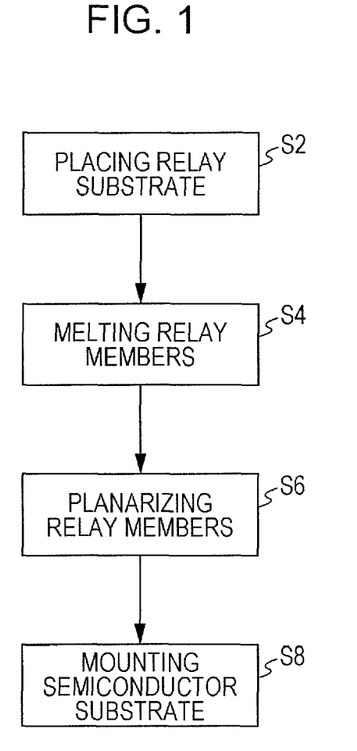
FIG. 1 is a flowchart depicting a semiconductor device manufacturing method according to an embodiment.

FIG. 1 is a flowchart depicting a semiconductor device manufacturing method according to the embodiment. Each of FIG. 2A, FIG. 2B, FIG. 3A, FIG. 3B, FIG. 4A and FIG. 4B is a process cross-sectional view depicting the semiconductor device manufacturing method according to the embodiment.

(i) Placing a Relay Substrate (Step S2)

Figure 2A:
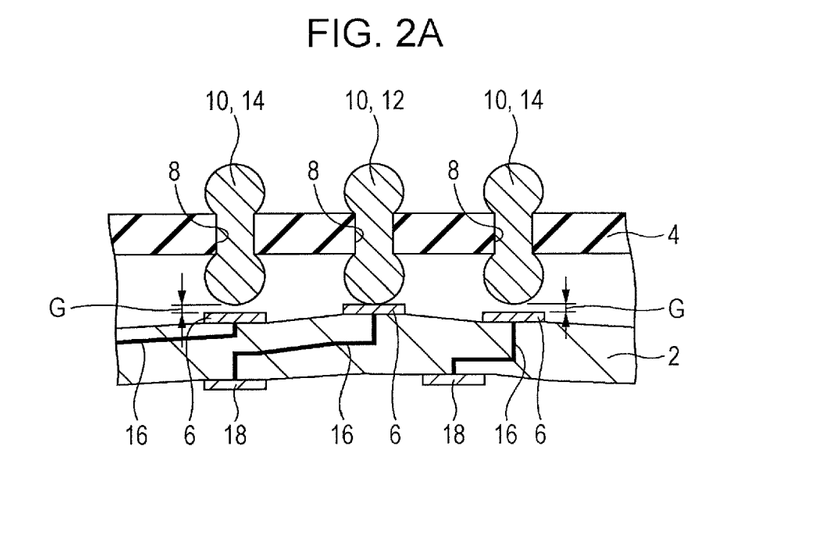

First, a relay substrate 4 (second substrate) is placed on a package substrate 2 (first substrate) as depicted in FIG. 2A. At this time, the relay substrate 4 is placed so that a plurality of substrate electrodes (first electrodes) 6 formed on a surface of the package substrate 2 are aligned with a plurality of through holes 8 formed in the relay substrate 4, as viewed from above. The relay substrate 4 has a plurality of relay members 10, formed of solder, each penetrating through one of the through holes 8 so as to project from both ends of the through hole 8.

As described later, a thermal stress bends the package substrate 2 and its surface may become uneven. The bend and unevenness cause some relay members 12 to make contact with the substrate electrode 6 and the other relay members 14 to be separated from the substrate electrode 6, as depicted in FIG. 2A.

Package Substrate

As depicted in FIG. 2A, the package substrate 2 includes a plurality of traces 16 and a plurality of substrate electrodes 6, each of which is connected to one of the plurality of traces 16. The plurality of substrate electrodes 6 are formed on a surface of the package substrate 2, for example, in a reticular pattern.

The ends of the traces 16 opposite to those connected to the substrate electrodes 6 are connected to external electrodes 18 of the package substrate 2. The external electrodes 18 are formed on the back of the package substrate 2, for example, in a reticular pattern. The spacing (pitch) between the external electrodes 18 is desirably wider than the spacing (pitch) between the substrate electrodes 6.

Figure 5:
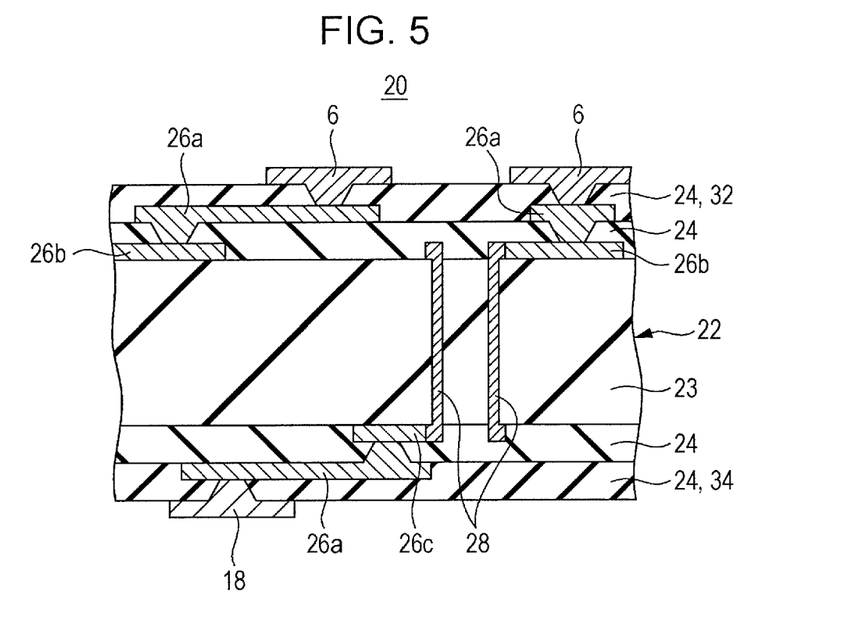
FIG. 5 is a cross-sectional view depicting an example of a package substrate.

FIG. 5 is a cross-sectional view depicting an example of a package substrate. The package substrate depicted in FIG. 5 is a build-up substrate 20.

The build-up substrate 20 includes a core layer 22 and a plurality of insulating layers 24 that are laminated on at least one surface of the core layer 22.

The build-up substrate 20 further includes the substrate electrodes 6 formed on the outermost insulating layer 32 on one surface of the core layer 22. The build-up substrate 20 further includes the external electrodes 18 formed on the outermost insulating layer 34 on the other surface of the core layer 22.

The build-up substrate 20 further includes a plurality of first wiring patterns 26a (including via patterns), each of which is formed on one of the plurality of the insulating layers 24.

The core layer 22 is a planar insulator (for example, polyimide) 23 in which through vias 28, second wiring patterns 26b formed at one ends of the through vias 28, and third wiring patterns 26c formed at the other ends of the through vias 28 are formed.

The first wiring patterns 26a, the second wiring patterns 26b, the third wiring patterns 26c, and the through vias 28 are conductive members. The first wiring patterns 26a, the second wiring patterns 26b, the third wiring patterns 26c, and the through vias 28 are interconnected to form the traces 16 (see FIG. 2A).

The package substrate 2 may be a substrate other than a built-up substrate. For example, the package substrate 2 may be a batch process laminated substrate.

Figure 6:
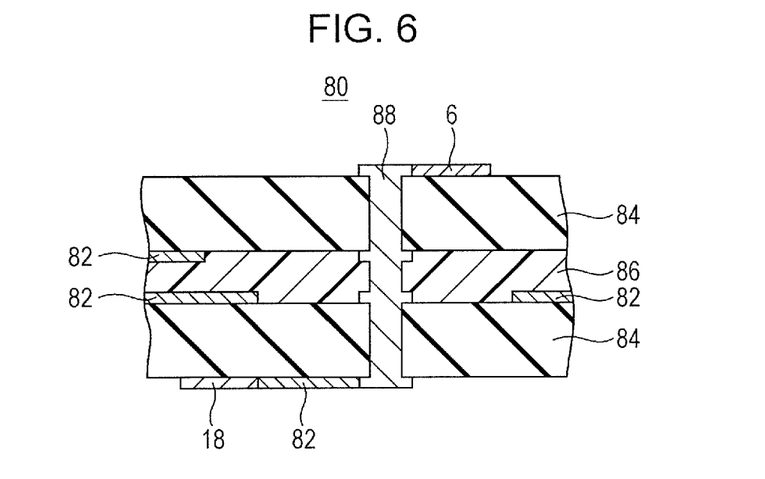
FIG. 6 is a cross-sectional view depicting an example of a batch process laminated substrate.

FIG. 6 is a cross-sectional view depicting an example of a batch process laminated substrate 80. The batch process laminated substrate 80 is obtained by laminating, via a prepreg 86 (synthetic resin), a plurality of insulating plates 84 (planar insulators) having a conductive wiring pattern 82 formed therein and bonding them by press working. The wiring pattern 82 is connected by a through via 88 that penetrates through plurality of insulating plates 84 and the prepreg 86.

As described above, the package substrate 2 (for example, the build-up substrate 20) includes various components. Each of the components is formed of a material with a different thermal expansion coefficient. For example, the wiring patterns 26a, 26b, and 26c of the build-up substrate 20 are formed of cupper and the insulating layer 24 is formed of epoxy resin.

In addition, at least a part (for example, the insulating layer 24) of the package substrate 2 is formed by heating its raw material (for example, liquid epoxy resin).

Accordingly, the difference between the forming temperature and the room temperature generates a thermal stress in the package substrate 2. The thermal stress bends the package substrate 2 and its surface may become uneven. In addition, since the package substrate 2 (for example, a batch process laminated substrate) is manufactured by press working, the package substrate 2 may be bent by fisheyes of press working. The difference in height of the substrate electrode 6 caused by the bend or unevenness of the package substrate 2 increases as the package substrate 2 becomes larger.

The package substrate 2 has an area, for example, 2 cm to 20 cm (preferably 47.5 mm or so) on a side. The package substrate 2 has a semiconductor mounting area, for example, 1 cm to 10 cm (preferably 20 mm or so) on a side. The planar shape of the package substrate 2 and the semiconductor mounting area is, for example, a square. The substrate electrode 6 is formed in this semiconductor mounting area. Unless otherwise specified, the package substrate, the relay substrate, and the semiconductor substrate are square-shaped.

The spacing (pitch) between the external electrodes 18 of the package substrate 2 is, for example, 0.5 mm to 2.0 mm (preferably 1 mm or so). The spacing (pitch) between the substrate electrodes 6 of the package substrate 2 is, for example, 0.1 mm to 1.0 mm (preferably 400 μm or so).

If one side of the package substrate 2 is approximately 47.5 mm in length, the difference in height caused by the bend or unevenness of the package substrate 2 is approximately 200 μm.

Relay Substrate

As depicted in FIG. 2A, the plurality of through holes 8 corresponding to the plurality of substrate electrodes 6, and the plurality of relay members 10, formed of solder, are disposed in the relay substrate 4. Each of the plurality of relay members 10 penetrates through one of the through holes 8 so as to project from both ends of the through hole 8.

Solder is wax, used for brazing, with a melting point less than 450° C. Brazing is a general name of methods for connecting parts (for example, metal) using wax (for example, alloy) with a melting point less than that of the members without melting them.

The relay substrate 4 is flatter than the package substrate 2 as depicted in FIG. 2A. That is, the coplanarity of the relay substrate 4 is higher than that of the package substrate 2.

The relay substrate 4 is a planar base material, formed of, for example, a single insulating material (for example, polyimide). The plurality of through holes 8 and the plurality of relay members 10 are formed in the relay substrate 4.

Since the base material (referred to below as the base material section) of the relay substrate 4 is formed of a single material, no thermal stress is generated when it is present alone. The relay members 10 penetrate through the relay substrate 4. The relay members 10 are formed of a material that differs from the base metal section.

Accordingly, a thermal stress is generated in the relay substrate 4 because there is a difference in the thermal expansion coefficient between the base material section and the relay members 10. However, the direction of the thermal stress is substantially orthogonal to the surface of the based material section. Accordingly, the relay substrate 4 formed of a single insulating material is flatter than the package substrate 2.

The relay substrate 4 is formed of insulating materials such as polyimide, aramid, polyether ether ketone, fluorocarbon resin, graphite, liquid crystal polymer, polyamide imide, polyarylate, polyetherimide, polysulfone, polyethersulfone, or polyphenylene sulfide.

However, the relay substrate 4 may be formed of composite materials such as glass fiber reinforced epoxy resin including epoxy resin and glass fiber. The relay substrate 4 may be formed of a Si semiconductor or so on. In this case, the walls of the through holes 8 are preferably covered with insulating films.

The relay members 10 is formed of, for example, Sn—Ag solder, Sn—Cu solder, Sn—Zn solder, or Sn—Ag—Cu solder, or so on.

Each of FIG. 7A, FIG. 7B, FIG. 7C and FIG. 7D is a process cross-sectional view depicting an example of a manufacturing method for the relay substrate 4.

Figure 7A:
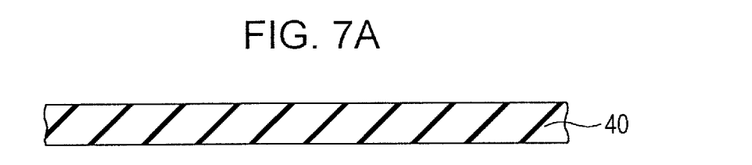

First, a polyimide film (planar base material) 40 with a thickness of 10 μm to 50 μm (preferably 25 μm or so) is prepared, as depicted in FIG. 7A. The polyimide film 40 is, for example, a square film, for example, 2 cm to 20 cm (preferably 47.5 mm or so) on a side. The thermal expansion coefficient of the polyimide film 40 is, for example, 16 ppm/° C. or so.

Figure 7B:
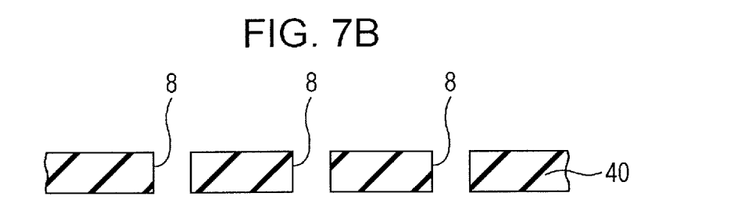

As depicted in FIG. 7B, a plurality of through holes 8 are formed in the polyimide film 40 in a reticular pattern using, for example, chemical etching. The spacing between the through holes 8 is, for example, 400 μm.

Figure 7C:
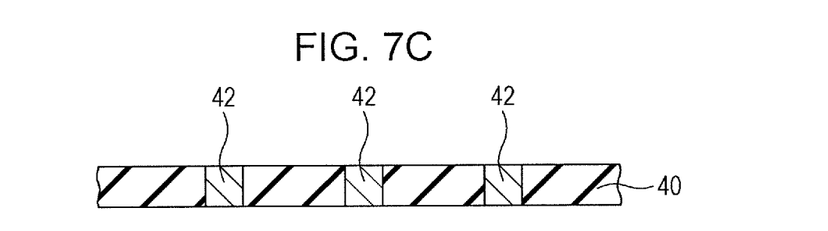

As depicted in FIG. 7C, the through holes 8 are filled with solder paste 42, in which one weight part flax is mixed with four weight parts SAC solder (Sn—Ag—Cu solder), through printing. Then, the solder paste 42 is heated to, for example, 100° C. to 150° C. so as to be solidified.

Figure 7D:
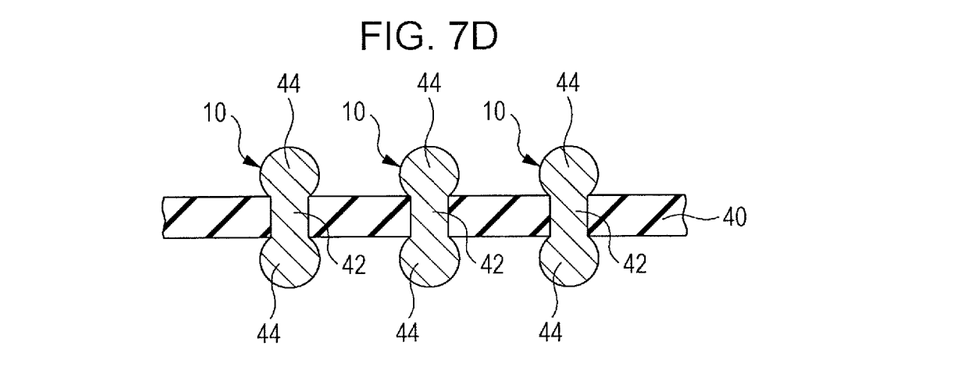
FIG. 7D is a process cross-sectional view depicting an example of a manufacturing method for a relay substrate.

As depicted in FIG. 7D, solder balls 44 are secured to both ends of the solidified solder paste 42 by using, for example, a solder ball mounter through ultrasonic bonding. The solder balls 44 are preferably formed of the same material (that is, SAC solder) as the solder with which the through holes 8 is filled. The relay members 10 are formed in this way.

(ii) Melting the Relay Members (Step S4)

Figure 2B:
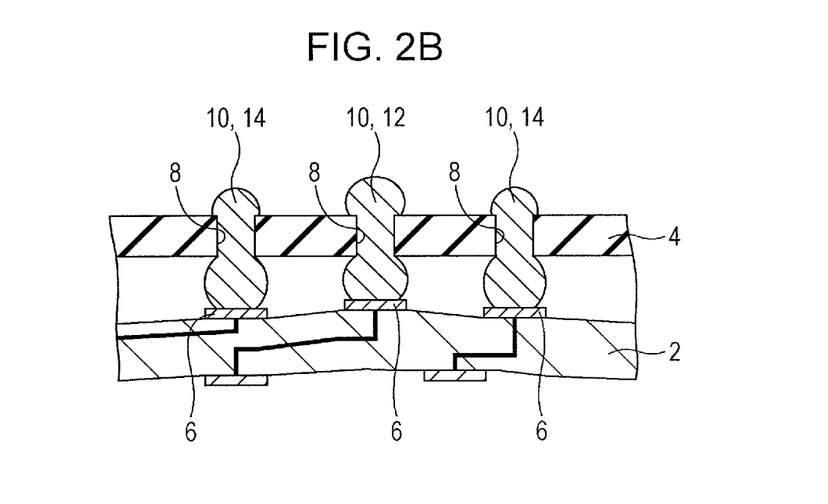
FIG. 2B is a process cross-sectional view depicting the semiconductor device manufacturing method according to the embodiment.

Next, as depicted in FIG. 2B, the plurality of relay members 10 are melted and connected to the plurality of substrate electrode 6. At this time, in the relay member 10, not only the part projecting from both ends of the through holes 8 but also the parts penetrating through the through holes 8 are melted.

This causes the relay member 14, which is separated from the substrate electrode 6 before being melted, to be lowered due to gravity and connected (soldered) to the substrate electrode 6. The relay member 12 in contact with the substrate electrode 6 before being melted is also connected (soldered) to the substrate electrode 6.

More specifically, for example, the relay substrate 4 placed on the package substrate 2 is heated in a reflow furnace. The maximum reflow temperature (heat temperature) is, for example, 240° C. This causes the relay member 10 to be melted and connected to the substrate electrode 6. The relay substrate 4 is placed on the package substrate 2 having the substrate electrode 6 to which solder paste (preliminary solder) has been applied, and the package substrate 2 and the relay substrate 4 may be heated in the reflow furnace.

(iii) Planarizing the Relay Members (Step S6)

Figure 3A:
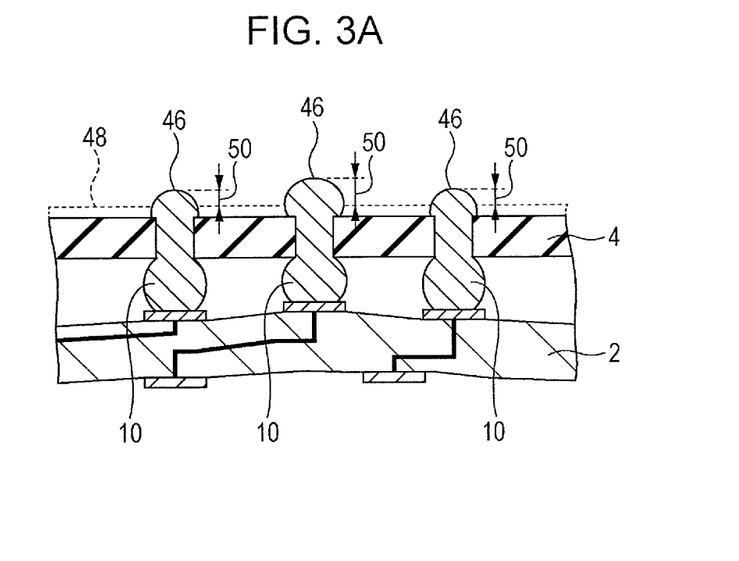
Figure 3B:
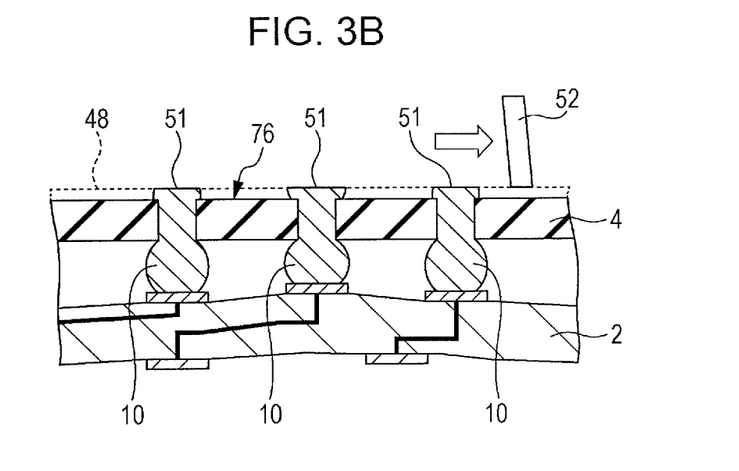
FIG. 3B is a process cross-sectional view depicting the semiconductor device manufacturing method according to the embodiment.

Next, as depicted in FIGS. 3A and 3B, for each of the relay members 10, a tip section 50 between a tip 46 opposite to the package substrate 2 across the relay substrate 4 and a plane 48 intersecting the plurality of relay members 10 on the opposite side is removed.

FIG. 3A depicts the state before the tip section 50 is removed. FIG. 3B depicts the state after the tip section 50 is removed.

Removal of the tip sections 50 forms upper surfaces 51 that are present on the single plane 48 on the relay members 10.

More specifically, as depicted in FIG. 3B, the plurality of relay members 10 are cut by a cutting tool 52 to remove the tip sections 50.

Figure 8:
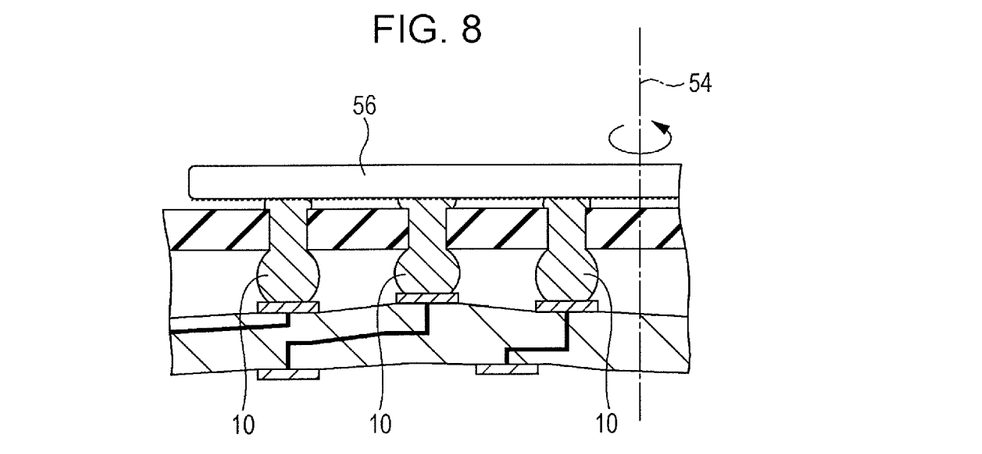
FIG. 8 depicts a method of planarizing a relay member through grinding.

FIG. 8 depicts a method of planarizing the relay members 10 through grinding. As depicted in FIG. 8, the tip sections 50 may be removed by, for example, grinding the plurality of relay members 10 using a grinder 56 pivoting about a rotary axis 54.

In steps S2 to S6 above, a semiconductor mounting substrate is formed.

(iv) Mounting a Semiconductor Substrate (Step S8)

Figure 4A:
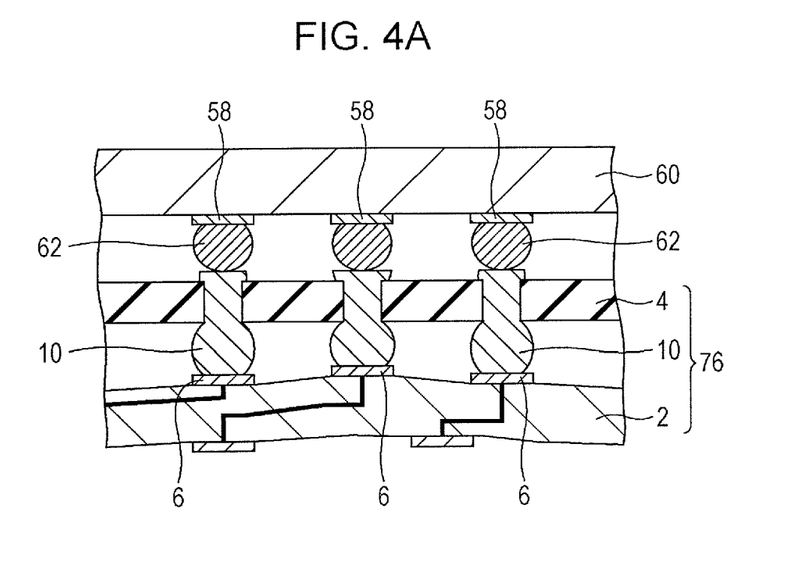

Next, as depicted in FIG. 4A, the semiconductor substrate 60 is placed on the opposite side of the package substrate 2 across the relay substrate 4. A plurality of chip electrodes (second electrodes) 58 corresponding to the plurality of substrate electrodes 6 are formed on the semiconductor substrate 60. In this state, as depicted in FIG. 4A, the plurality of substrate electrodes 6 and the plurality of chip electrodes 58 are connected to each other via the plurality of relay members 10.

Figure 9:
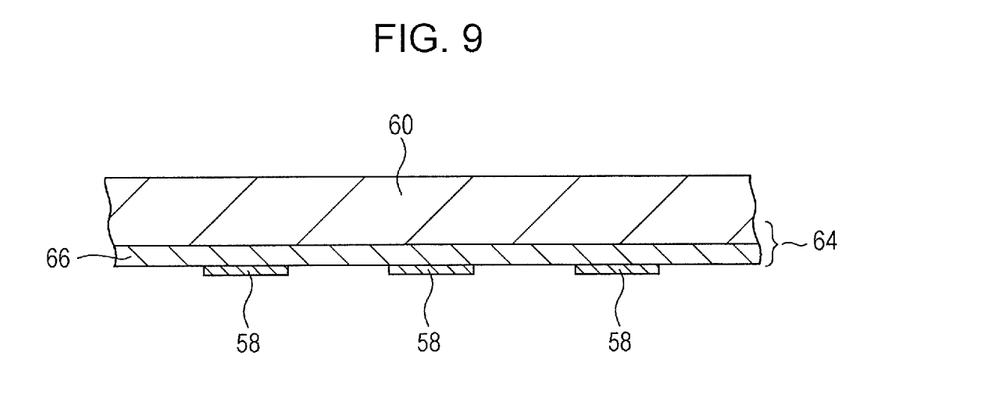
FIG. 9 depicts an example of a cross-sectional view of a semiconductor substrate.

FIG. 9 depicts an example of a cross-sectional view of the semiconductor substrate 60. An integrated circuit 64 is formed on a surface of the semiconductor substrate 60.

The integrated circuit 64 includes a semiconductor device (such as a metal oxide semiconductor (MOS) field-effect transistor, not depicted) on a surface on the semiconductor substrate 60 and a multilayer wiring layer 66 connected to the semiconductor device.

The chip electrodes 58 are further formed on semiconductor substrate 60. The chip electrodes 58 are formed on, for example, an outermost surface of the multilayer wiring layer 66.

Figure 4B:
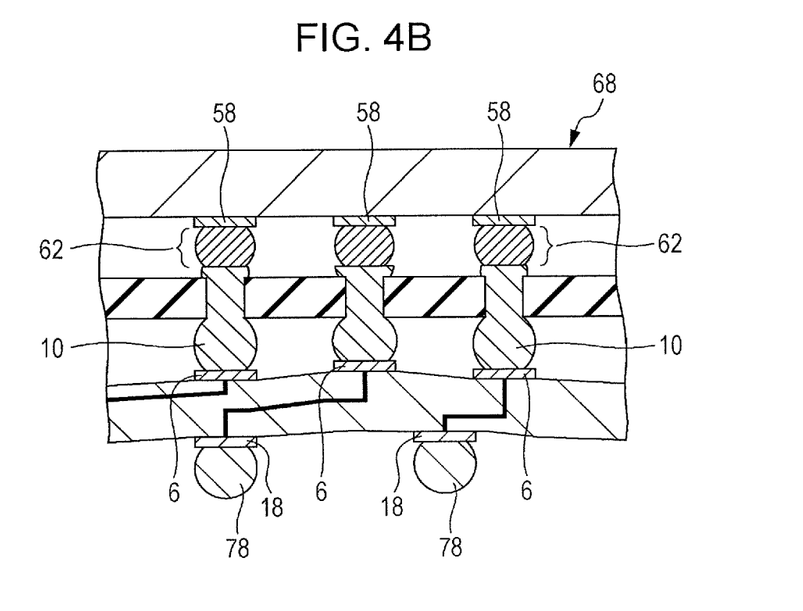
FIG. 4B is a process cross-sectional view depicting the semiconductor device manufacturing method according to the embodiment.

In FIGS. 4A and 4B, the integrated circuit 64 is omitted. This is the same as in FIG. 10.

More specifically, a frame-like stiffener (not depicted) with a thickness of approximately 300 μm is first prepared. The length of an outer side of the stiffener is substantially the same as the length (for example, 47.5 mm) of a side of the relay substrate 4. The length (for example, 35 mm) of an inner side of the stiffener is longer than the length (for example, 20 mm) of a side of the semiconductor substrate 60.

The prepared stiffener (not depicted) is adhered to the relay substrate 4 via a bonding sheet. Then, as depicted in FIG. 4A, the semiconductor substrate 60 having the chip electrodes 58 formed thereon is placed on a semiconductor mounting substrate 76. Preferably, solder balls 62 are jointed to the chip electrodes 58.

The semiconductor mounting substrate 76 and the semiconductor substrate 60 are heated in a reflow furnace to melt the relay members 10 and the solder balls 62. The maximum heat temperature is, for example, 240° C. The solder balls 62 are formed of, for example, the material (for example, SAC solder) that forms the relay members 10.

Accordingly, as depicted in FIG. 4B, the plurality of substrate electrode 6 are connected to the plurality of chip electrodes 58 via the plurality of relay members 10. That is, the semiconductor substrate 60 is mounted (installed) on the semiconductor mounting substrate 76.

In the example depicted in FIG. 4B, the chip electrodes 58 are connected to the relay members 10 via the solder balls 62. However, the chip electrodes 58 and the relay members 10 may be directly connected to each other.

In the above process, a semiconductor device 68 is manufactured.

The semiconductor device 68 is mounted on a circuit board (for example, printed-circuit board) such as a mother board. More specifically, the external electrodes 18 are soldered to electrodes disposed on a circuit board.

In the above example, as depicted in FIG. 4A, the semiconductor substrate 60 is placed on the semiconductor mounting substrate 76. However, the substrate electrodes 6 and the chip electrodes 58 may be connected to each other in a state where the semiconductor mounting substrate 76 is placed on the semiconductor substrate 60.

(2) Suppressing a Mounting Failure

Figure 10:
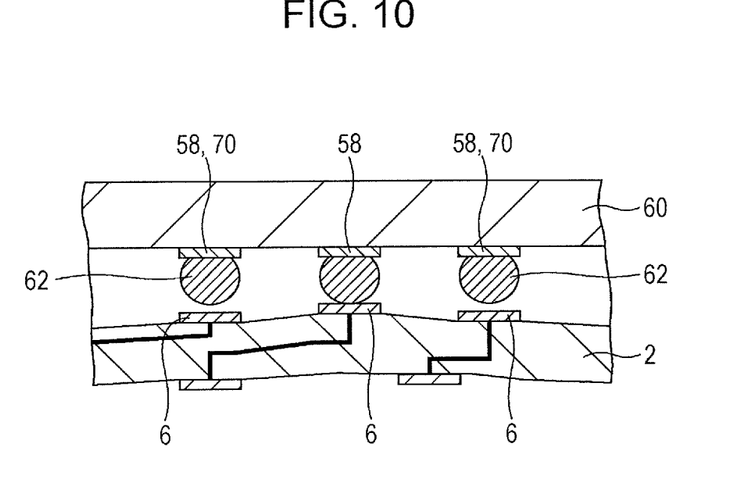
FIG. 10 is a cross-sectional view depicting a manufacturing method for a semiconductor device in which a semiconductor substrate is directly mounted on a package substrate.

FIG. 10 is a cross-sectional view depicting a manufacturing method for a semiconductor device in which the semiconductor substrate 60 is directly mounted on the package substrate 2.

The package substrate 2 is, for example, a build-up substrate or batch process laminated substrate. Accordingly, the package substrate 2 is bent and its surface is uneven. The upper surfaces of the substrate electrodes 6 are not present on a single plane.

The chip electrodes 58 corresponding to the substrate electrodes 6 are formed on the semiconductor substrate 60. The solder balls 62 are connected to the chip electrodes 58.

The semiconductor substrate 60 is mounted on the package substrate 2, for example, as described below.

First, the semiconductor substrate 60 is placed on the package substrate 2 so that the chip electrodes 58 are aligned with the substrate electrodes 6, as depicted in FIG. 10. In this state, solder bumps 62 are melted in the reflow process to connect the chip electrodes 58 and the substrate electrodes 6 to each other. As a result, a semiconductor device in which the semiconductor substrate 60 is directly mounted on the package substrate 2 is formed.

As described above, the upper surfaces of the substrate electrodes 6 are not present on a single plane. Accordingly, when the semiconductor substrate 60 is placed on the package substrate 2, only some solder balls make contact with the substrate electrodes 6 and space is left between the other solder balls and the substrate electrode 6.

If the space is small, the solder balls 62 melted in the reflow process are deformed gravitationally and make contact with the substrate electrodes 6. As a result, the chip electrodes 58 and the substrate electrodes 6 are soldered to each other.

The larger the package substrate 2, the larger the bend and unevenness of the package substrate 2. This increases the space between the solder balls 62 and the substrate electrodes 6 and, even if the solder balls 62 are melted, they do not make contact with the substrate electrodes 6. As a result, some of the chip electrodes 58 are not connected to the substrate electrode 6.

For example, there is a difference in height of approximately 200 μm on a package substrate (for example, a built-up substrate) with a side of 5 cm. When the spacing (pitch) between the chip electrodes 58 is approximately 400 μm, the solder balls 62 has a diameter of approximately 200 μm. In this case, there is a large gap between some solder balls and substrate electrodes 6, which is substantially the same as the diameter of the solder balls. As a result, some of the chip electrodes 70 are not connected to substrate electrodes 6.

The diameter of the solder balls 62 is at most half the spacing (pitch) between the chip electrodes 58 or so. For example, when the spacing between the chip electrodes 58 is 400 μm, the diameter of the solder balls 62 is at most 200 μm or so.

Accordingly, the smaller the spacing between the chip electrodes 58, the smaller the diameter of the solder balls 62. This reduces the amount of deformation of solder bumps when they are melted. Accordingly, even if the spacing between the chip electrodes 58 is just reduced, the chip electrodes 58 are difficult to connect to the substrate electrodes 6.

When solder paste is applied to the substrate electrodes 6 and then the semiconductor substrate 60 is placed on the package substrate 2, differences in the thickness of the solder paste increase variations in the spacing between the solder balls 62 and the substrate electrode 6. As a result, the chip electrodes 58 not connected to the substrate electrode 6 are easily generated. As described above, only application of the solder paste to the substrate electrode 6 makes it difficult to connect the substrate electrode 6 and the chip electrodes 58 to each other.

On the other hand, in the manufacturing method according to the embodiment, the upper surfaces 51 (see FIG. 3B) of the relay members 10 are present on the single plane 48. Accordingly, as depicted in FIG. 4A, substantially all of the semiconductor balls 62 of the semiconductor substrate 60 make contact with the upper surfaces 51 of the relay members 10. This makes it difficult to cause failed connection between the chip electrodes 58 and the substrate electrode 6.

A cross-section of the semiconductor device 68 (see FIG. 4B) according to the embodiment may be observed by a scan acoustic tomograph. As a result of observation of the cross-section of the semiconductor device 68, substantially all of the chip electrodes 58 are connected to the substrate electrode 6 via the solder balls 62 and the relay members 10. Accordingly, the embodiment suppresses failed connection between the chip electrodes 58 and the substrate electrode 6.

In addition, the connection between the chip electrodes 58 and the substrate electrodes 6 provided by the embodiment is difficult to release even if a thermal cycle is repeated. For example, if a thermal cycle test in which a temperature raised from −25° C. to +125° C. is repeated 1000 times is performed, detachment of the relay members 10 from the substrate electrodes 6 is not observed. Similarly, neither detachment of the relay members 10 from the solder balls 62 nor detachment of the solder balls 62 from the chip electrodes 58 is observed.

In the embodiment, as depicted in FIG. 3B, the tips of the relay members 10 penetrating through the relay substrate 4 are cut or grinded, so that the upper surfaces of plurality of relay members 10 are formed on the single plane 48. Also in the semiconductor device depicted in FIG. 10, it is considered that solder bumps are disposed on the substrate electrode 6 and their tip sections are cut or grinded to suppress failed connection between the chip electrodes 58 and the substrate electrode 6.

Figure 11A:
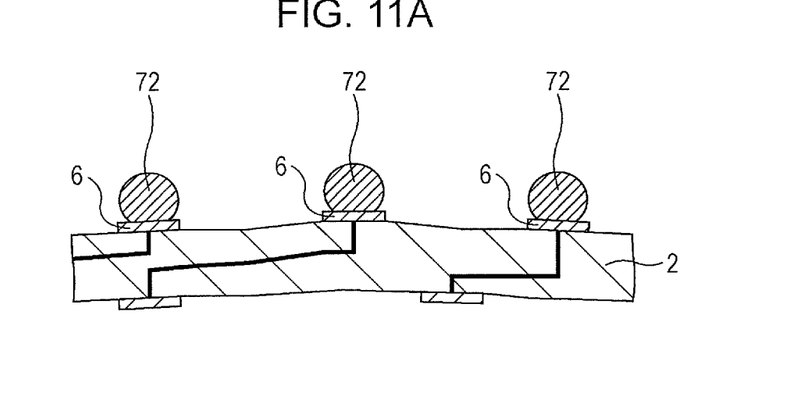
Figure 11B:
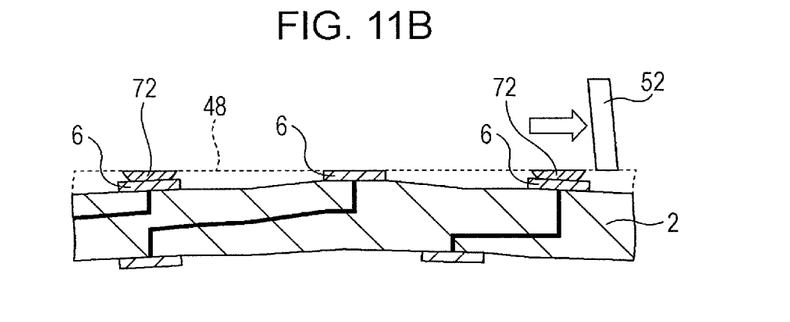
FIG. 11B is a cross-sectional view depicting a problem caused when solder bumps formed on substrate electrodes are cut or ground.

Each of FIG. 11A and FIG. 11B is a cross-sectional view depicting a problem caused when solder bumps 72 formed on the substrate electrodes 6 are cut or ground.

FIG. 11A depicts the state before the solder bumps 72 on the substrate electrodes 6 are cut. FIG. 11B depicts the state after the solder bumps 72 are cut.

As depicted in FIG. 11A, the package substrate 2 is bent and its surface may be uneven. Therefore, if the tip sections of the solder bumps 72 are cut, some (for example, the substrate electrode in the middle in FIG. 11B) of the substrate electrodes 6 may be cut. In addition, the package substrate 2 may be cut. Accordingly, it is difficult to adopt the method of cutting or grinding the solder bumps on the substrate electrodes 6.

Another method of reducing the difference in height of the solder bumps 72 is to pushing a metal mold against the solder bumps 72 instead of cutting or grinding the solder bumps on the substrate electrodes 6.

Figure 12A:
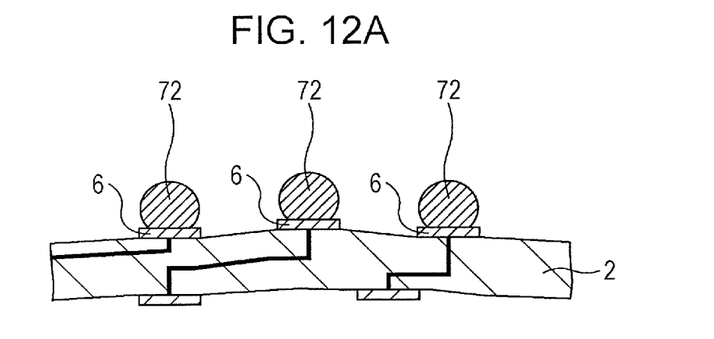
Figure 12B:
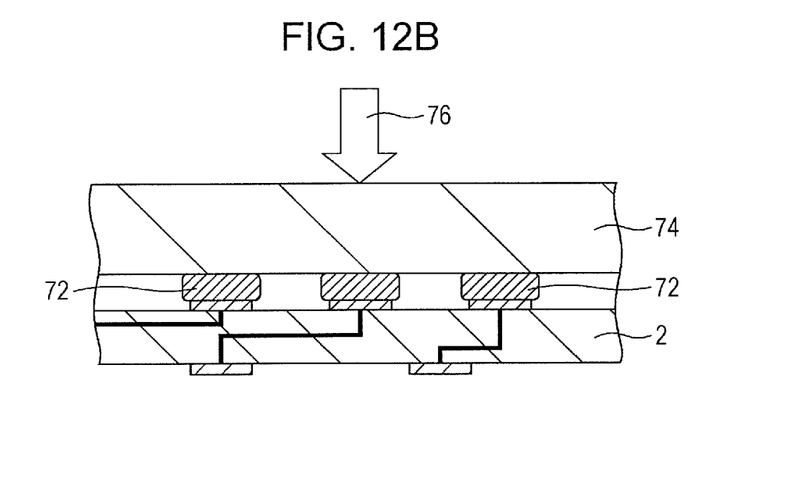
Figure 12C:
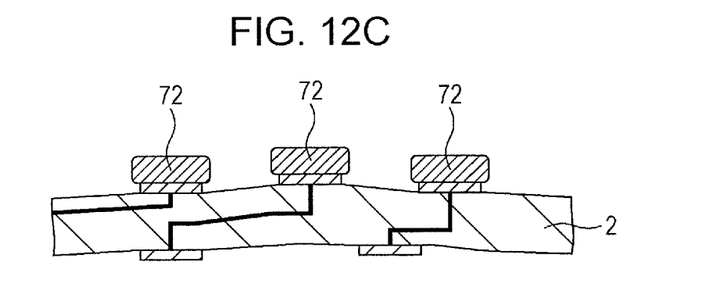
FIG. 12C is a sectional view depicting a problem with a method for pushing a metal mold against solder bumps on substrate electrodes.

Each of FIG. 12A, FIG. 12B and FIG. 12C is a sectional view depicting a problem with a method for pushing a metal mold against solder bumps 72 on the substrate electrodes 6.

FIG. 12A depicts the state before a metal mold is pushed against the solder bumps 72 on the substrate electrodes 6. FIG. 12B depicts the state when a metal mold 74 is being pushed against the solder bumps 72. FIG. 12C depicts the state after the metal mold 74 is removed.

As depicted in FIG. 12A, the package substrate 2 is bent and its surface may be uneven. As depicted in FIG. 12B, if the metal mold 74 is pushed against the solder bumps 72, upper surfaces that are present on a single plane are formed on the solder bumps 72. At this time, the package substrate 2 is temporarily planarized by the pressure applied through the solder bumps 72.

As depicted in FIG. 12C, after the metal mold 74 is removed, the package substrate 2 is bent and becomes uneven again. This disables the upper surfaces of the solder bumps 72 to be present on a single plane.

Accordingly, it is also difficult to adopt a method in which a metal mold is pushed against the solder bumps 72 on the substrate electrodes 6.

In the examples depicted in FIGS. 2 and 3, the package substrate 2 is bent toward the relay substrate 4. The manufacturing method according to the embodiment is applicable when the package substrate 2 is bent in the direction opposite to the relay substrate 4.

The difference $\Delta 1$ in height of the tips 46 (see FIG. 3A) of the relay members 10 after being melted is smaller than the maximum value of the spacing G (see FIG. 2A) between the relay member 14 and the substrate electrode 6.

The difference $\Delta 1$ in height of the tips 46 of the relay members 10 after being melted is equal to the difference between the maximum value $X_{max}$ and the minimum value $X_{min}$ of the descent amount (more exactly, the descent amount of the tip section) of the relay members 10 melted ($\Delta 1$=maximum value $X_{max}$−minimum value $X_{min}$). The descent amount X of the relay member 14 (see FIG. 2A) not in contact with the substrate electrode 6 is approximately the same as the spacing G between the relay member 14 and the substrate electrode 6. Accordingly, the maximum descent amount $X_{max}$ of the relay member 10 is approximately the same as the maximum value $G_{max}$ of the spacing G between the relay member 14 and the substrate electrode 6.

The minimum descent amount $X_{min}$ of the relay member 10 is equal to the descent amount X1 of the relay member 12 (see FIG. 2A) in contact with the substrate electrode 6. The descent amount X1 of the relay member 12 in contact with the substrate electrode 6 is small, but not 0 (that is, X1>0).

Accordingly, the difference $\Delta 1$ ($=X_{max} - X_{min} = G_{max} - X1 < G_{max}$) in height of the tips 46 of the relay members 10 after being melted is smaller than the maximum value $G_{max}$ of the spacing G between the relay member 14 and the substrate electrode 6.

The maximum value $G_{max}$ of the spacing between the relay member 14 and the substrate electrode 6 is equal to the difference $\Delta 2$ in height of the substrate electrodes 6 (that is, $\Delta 2 = G_{max}$). Accordingly, the difference $\Delta 1$ ($<G_{max}$) in height of the tips 46 of the relay members 10 after being melted is smaller than the difference $\Delta 2$ ($=G_{max}$) in height of the substrate electrodes 6.

For this reason, failed connection between the chip electrodes 58 and the substrate electrodes 6 is suppressed to some extent without planarization of the relay members 10 (step S6). That is, planarization of the relay members 10 (step S6) may be omitted.

As described above, the larger the package substrate 2, the larger the bend of the package substrate 2. The manufacturing method according to the embodiment is more effective for the package substrate 2 with a larger size. However, it is more difficult to manufacture the package substrate 2 with a larger size.

Accordingly, the package substrate 2 preferably has a size within a certain range. For example, the diagonal line of the package substrate 2 is preferably not less than 2.8 cm and not more than 28 cm in length. More preferably, the diagonal line of the package substrate 2 is not less than 5.7 cm and not more than 21.2 cm in length. The package substrate 2 may be a rectangle.

On the other hand, the smaller the spacing (pitch) between the substrate electrodes 6, the smaller the solder balls 62. Therefore, even in a semiconductor device without the relay substrate 4 (see FIG. 10), the smaller the spacing (pitch) between the substrate electrodes 6, the smaller the amount of deformation caused when the solder balls 62 are melted. As a result, it becomes difficult to connect the chip electrodes 58 to the substrate electrodes 6.

The manufacturing method according to the embodiment is more effective for the substrate electrodes 6 with a smaller spacing (pitch). However, it is more difficult to joint the solder balls 62 to the chip electrodes 58 as the spacing (pitch) of the substrate electrodes 6 is reduced.

Accordingly, the spacing (pitch) between the substrate electrodes 6 preferably falls within a certain range. For example, the spacing (pitch) between the substrate electrodes 6 is preferably not less than 100 μm and not more than 400 μm. More preferably, the spacing (pitch) between the substrate electrodes 6 is not less than 200 μm and not more than 300 μm.

(3) Suppressing a Mounting Failure Caused by Lateral Displacement

Figure 13:
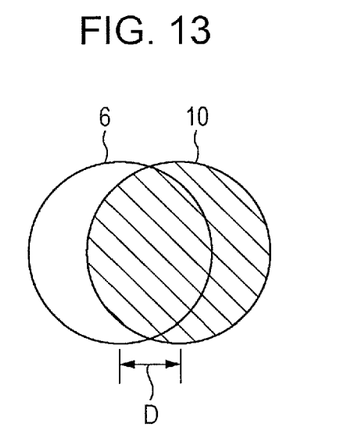
FIG. 13 depicts a lateral displacement problem in the reflow process.

FIG. 13 depicts a lateral displacement problem in the reflow process. FIG. 13 depicts an example of the substrate electrode 6 and the relay member 10 seen through the relay substrate 4 (see FIG. 2A) placed on the package substrate 2.

It is assumed that the relay substrate 4 is placed on the package substrate 2 so that the center of the substrate electrode 6 is aligned with the center of the relay member 10 in the middle of the package substrate 2. As described above, the package substrate 2 is bent and its surface may be uneven. Therefore, in a position away from the middle of the package substrate 2, the relay members 10 is displaced in a lateral direction (direction along the surface of the package substrate 2) from the substrate electrode 6, as depicted in FIG. 13.

If the thermal expansion coefficient of the package substrate 2 differs from that of the relay substrate 4, lateral displacement D (see FIG. 13) between the substrate electrode 6 and the relay members 10 may become large in the reflow process. This may cause failed connection between the relay members 10 and the substrate electrode 6.

To suppress lateral displacement in the reflow process, it is preferable that the planar base material 40 (see FIG. 7A, FIG. 7B, FIG. 7C and FIG. 7D) of the relay substrate 4 be formed of a single insulating material and that the package substrate 2 be the built-up substrate 20 having the core layer 22 formed of the single insulating material. The planar base material 40 of the relay substrate 4 and the core layer 22 of the build-up substrate 20 are formed of, for example, polyimide.

As depicted in FIG. 5, a large part of the build-up substrate 20 is the core layer 22. Accordingly, in the above structure, the thermal expansion coefficient of the build-up substrate 20 is substantially the same as thermal expansion coefficient (for example, 16 ppm/° C.) of the relay substrate 4. This means that lateral displacement D hardly increases in the reflow process. Accordingly, a mounting failure (failed connection between the relay member 10 and the substrate electrode 6) caused by the lateral displacement in the reflow process is suppressed.

To suppress a mounting failure in the reflow process, the package substrate 2 may be a batch process laminated substrate 80 having insulating plates 84 (see FIG. 6) formed of the insulating material (for example, polyimide) included in the relay members 10. Even in this batch process laminated substrate 80, since the insulating plates 84, which are formed of the same material as in the relay members 10, constitute more than half of the substrate, a mounting failure caused by the reflow process is suppressed.

Thermal expansion in the reflow process also causes the relay members 10 to be displaced from the chip electrodes 58 (see FIG. 4A). Since the upper surfaces 51 (see FIG. 3B) of the relay members 10 are present on the single plane 48, all of the chip electrodes 58 are accurately aligned with the relay members 10 before the reflow process. Accordingly, lateral displacement of the relay members 10 from the chip electrodes 58 caused by the reflow process does not easily lead to a mounting failure.

(4) Semiconductor Mounting Substrate

Figure 14:
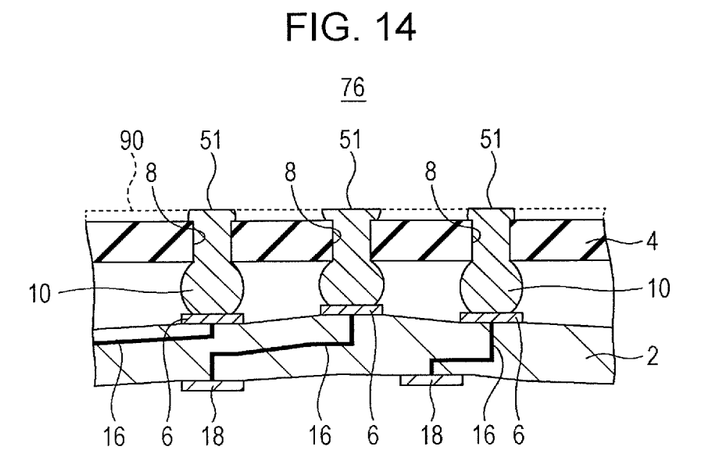
FIG. 14 is a cross-sectional view of a semiconductor mounting substrate formed from relay substrate placement to relay member planarization.

FIG. 14 is a cross-sectional view of a semiconductor mounting substrate 76 formed from relay substrate placement (step S2) to relay member planarization (step S6).

The semiconductor mounting substrate 76 includes the package substrate 2 and the relay substrate 4 as depicted in FIG. 14. The plurality of traces 16 and the plurality of the substrate electrodes 6, each being connected to one of the plurality of the traces 16, are formed on the package substrate 2.

The plurality of through holes 8 corresponding to the plurality of substrate electrodes 6 and the plurality of relay members 10, each of which penetrates through one of the plurality of through holes 8, projects from both ends of the one of the plurality of through holes 8, and has one end connected to one of the plurality of substrate electrodes 6, are disposed in the relay substrate 4. The relay members 10 are formed of solder.

As depicted in FIG. 14, the upper surfaces of the relay members 10 are present on a single plane 90 on a side opposite to the package substrate 2 across the relay substrate 4.

Accordingly, when the semiconductor substrate 60 is place on the semiconductor mounting substrate 76, substantially all of the solder balls 62 connected to the chip electrodes 58 make contact with the relay members 10, as depicted in FIG. 4A and FIG. 4B. If the relay members 10 and the solder balls 62 are melted in this state, substantially all of the chip electrodes 58 are connected to the substrate electrodes 6. That is, the semiconductor mounting substrate 76 suppresses failed connection between the chip electrodes 58 disposed on the semiconductor substrate 60 and the substrate electrodes 6.

Presence of the upper surfaces 51 of the relay members 10 on the single plane 90 means contact with the plane 90 on which the upper surfaces 51 of the relay members 10 are present or intersection with the surfaces at a sufficiently small angle (for example, 10° or less, 6° or less, or 2° or less).

Specific examples of the package substrate 2 and the relay substrate 4 are given in the description from "(1) Manufacturing method" to "(3) Suppressing a mounting failure caused by lateral displacement".

In the above examples, the relay substrate 4 has the same size as the package substrate 2. However, the relay substrate 4 may be smaller than the package substrate 2 and a heat spreader may be mounted on the package substrate 2.

In the above examples, the relay substrate 4 and the semiconductor substrate 60 are mounted on the package substrate 2. However, the relay substrate 4 and the semiconductor substrate 60 may be mounted on a wiring board (such as, for example, a mother board) incorporating other electronic components (such as ICs or capacitors), instead of the package substrate 2.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor mounting substrate comprising:
   a first substrate on which a plurality of traces and a plurality of first electrodes are formed, each of the plurality of first electrodes being connected to one of the plurality of first traces; and
   a second substrate in which a plurality of through holes corresponding to the plurality of first electrodes and a plurality of relay members are disposed, each of the plurality of relay members being formed of solder, penetrating through one of the plurality of through holes, projecting from both ends of the one of the plurality of through hole, and having one end connected to one of the plurality of first electrode,
   wherein the plurality of relay members have upper surfaces on a single plane opposite to the first substrate across the second substrate.

2. The semiconductor mounting substrate according to claim 1,
   wherein the second substrate is a planar base material that is formed of a single insulating material and has the plurality of through holes and the plurality of relay members disposed therein.

3. The semiconductor mounting substrate according to claim 2,
   wherein the first substrate is a built-up substrate having a core layer formed of the insulating material or a batch process laminated substrate including a plurality of laminated insulating plates, each having a wiring pattern disposed thereon and being formed of the insulating material.

4. The semiconductor mounting substrate according to claim 2,
   wherein the insulating material is polyimide.

* * * * *